United States Patent
Chen et al.

(10) Patent No.: US 9,691,922 B2
(45) Date of Patent: Jun. 27, 2017

(54) ADJUSTING DEVICE

(71) Applicants: Fu Tai Hua Industry (Shenzhen) Co., Ltd., Shenzhen (CN); HON HAI PRECISION INDUSTRY CO., LTD., New Taipei (TW)

(72) Inventors: Ching-Feng Chen, New Taipei (TW); Long-Fong Chen, New Taipei (TW); Lin Chen, Shenzhen (CN); Li-Yun Kuang, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

(*) Notice: Subject to any disclaimer, the term of this patent is extended or adjusted under 35 U.S.C. 154(b) by 1129 days.

(21) Appl. No.: 13/850,320

(22) Filed: Mar. 26, 2013

(65) Prior Publication Data

US 2013/0276863 A1 Oct. 24, 2013

(30) Foreign Application Priority Data

Apr. 20, 2012 (CN) .......................... 2012 1 0117493

(51) Int. Cl.
| | | |
|---|---|---|
| *F24J 2/00* | (2014.01) | |
| *H01L 31/042* | (2014.01) | |
| *H01L 31/052* | (2014.01) | |
| *H01L 31/048* | (2014.01) | |
| *F24J 2/38* | (2014.01) | |
| *F24J 2/54* | (2006.01) | |

(Continued)

(52) U.S. Cl.
CPC ............ *H01L 31/0422* (2013.01); *F24J 2/38* (2013.01); *F24J 2/5431* (2013.01); *H01L 31/048* (2013.01); *H01L 31/052* (2013.01); *H02S 20/30* (2014.12); *H02S 30/10* (2014.12); *Y02E 10/47* (2013.01); *Y02E 10/50* (2013.01)

(58) Field of Classification Search
CPC . H01L 31/0422; H01L 31/048; H01L 31/052; H02S 20/30; H02S 20/00; H02S 30/10; F24J 2/38; F24J 2/5431; Y02E 10/47; Y02E 10/50
USPC ....................... 248/278.1, 466, 469, 474, 913
See application file for complete search history.

(56) References Cited

U.S. PATENT DOCUMENTS

| | | | | |
|---|---|---|---|---|
| 2,416,976 A | * | 3/1947 | Barbieri | ................... A47G 1/14 |
| | | | | 248/474 |
| 3,191,901 A | * | 6/1965 | Green | ................... A47G 29/08 |
| | | | | 248/116 |

(Continued)

*Primary Examiner* — Anita M King
(74) *Attorney, Agent, or Firm* — Steven Reiss

(57) ABSTRACT

An adjusting device for adjusting orientation of an energy conversion board comprises a first frame member, a second frame member, a third frame member and a base. The first frame member contains the energy conversion board. The second frame member holds the first frame member. The third frame member holds the second frame member. The base supports the third frame including the other frames and the energy conversion board. The first frame member is rotatable relative to the second frame member, the second frame member is rotatable relative to the third frame, and the third frame member is rotatable relative to the base. The first rotating axis is perpendicular to the second rotating axis, and the third rotating axis is coaxial with the first rotating axis.

14 Claims, 6 Drawing Sheets

(51) Int. Cl.
 *H02S 30/10* (2014.01)
 *H02S 20/30* (2014.01)

(56) References Cited

U.S. PATENT DOCUMENTS 4,171,003 A * 10/1979 Forrat .................. H01L 31/052
 126/684
4,337,506 A * 6/1982 Terada .................... F21S 6/002
 362/142
4,429,952 A * 2/1984 Dominguez ............... F24J 2/38
 126/576

* cited by examiner

ADJUSTING DEVICE

BACKGROUND

1. Technical Field

The present disclosure relates to energy conversion devices, and particularly relating to an adjusting device of an energy conversion device for adjusting position of an energy conversion board of the energy conversion device.

2. Description of Related Art

A solar panel can be fixed on a base to collect sunlight. However, if the panel or the base is at a fixed angle, the light received by the solar panel as the Sun moves across the sky is uneven. Thus, the utilization rate of the solar energy may be reduced.

Therefore, there is need to overcome the above-described shortcoming.

BRIEF DESCRIPTION OF THE DRAWINGS

The components in the drawings are not necessarily drawn to scale, the emphasis instead being placed upon clearly illustrating the principles of the energy conversion device. Moreover, in the drawings, like reference numerals designate corresponding parts throughout the several views.

DETAILED DESCRIPTION

Embodiments of the present disclosure will be described with reference to the accompanying drawings.

Figure 1:
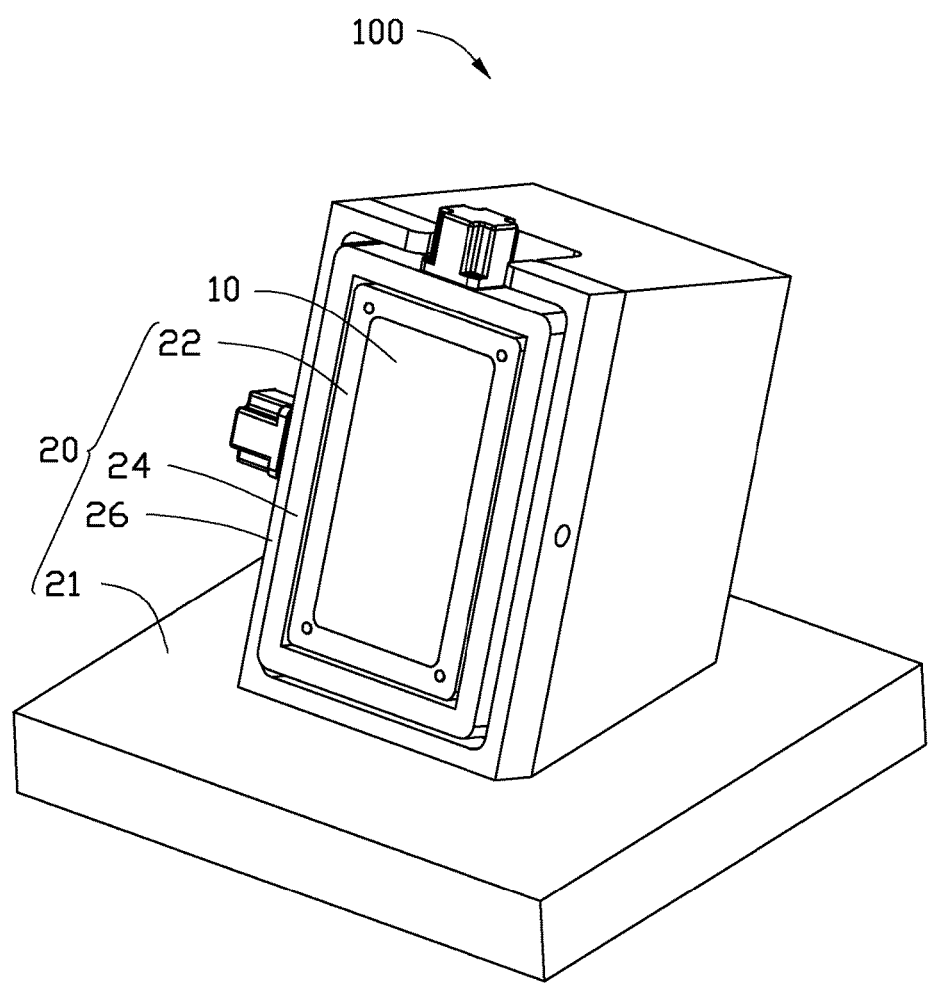
FIG. 1 is an isometric view of an energy conversion device in accordance with an embodiment, the energy conversion device being in an initial state.

Referring to FIG. 1, an isometric view of an energy conversion device 100 in accordance with an embodiment is shown. The energy conversion device 100 includes an energy conversion board 10 and an adjusting device 20 supporting the energy conversion board 10 and automatically adjusting the orientation of the energy conversion board 10. The energy conversion board 10 is used for collecting a first type of energy and converting the first type of energy into a second type of energy. In this embodiment, the energy conversion board 10 is a solar panel for converting solar energy into electrical energy. The adjusting device 20 includes a base 21, a first frame member 22, a second frame member 24 and a third frame member 26. The base 21 supports the energy conversion board 10, the first frame member 22, the second frame member 24 and the third frame member 26. The energy conversion board 10 is fixed and received in the first frame member 22.

Figure 2:
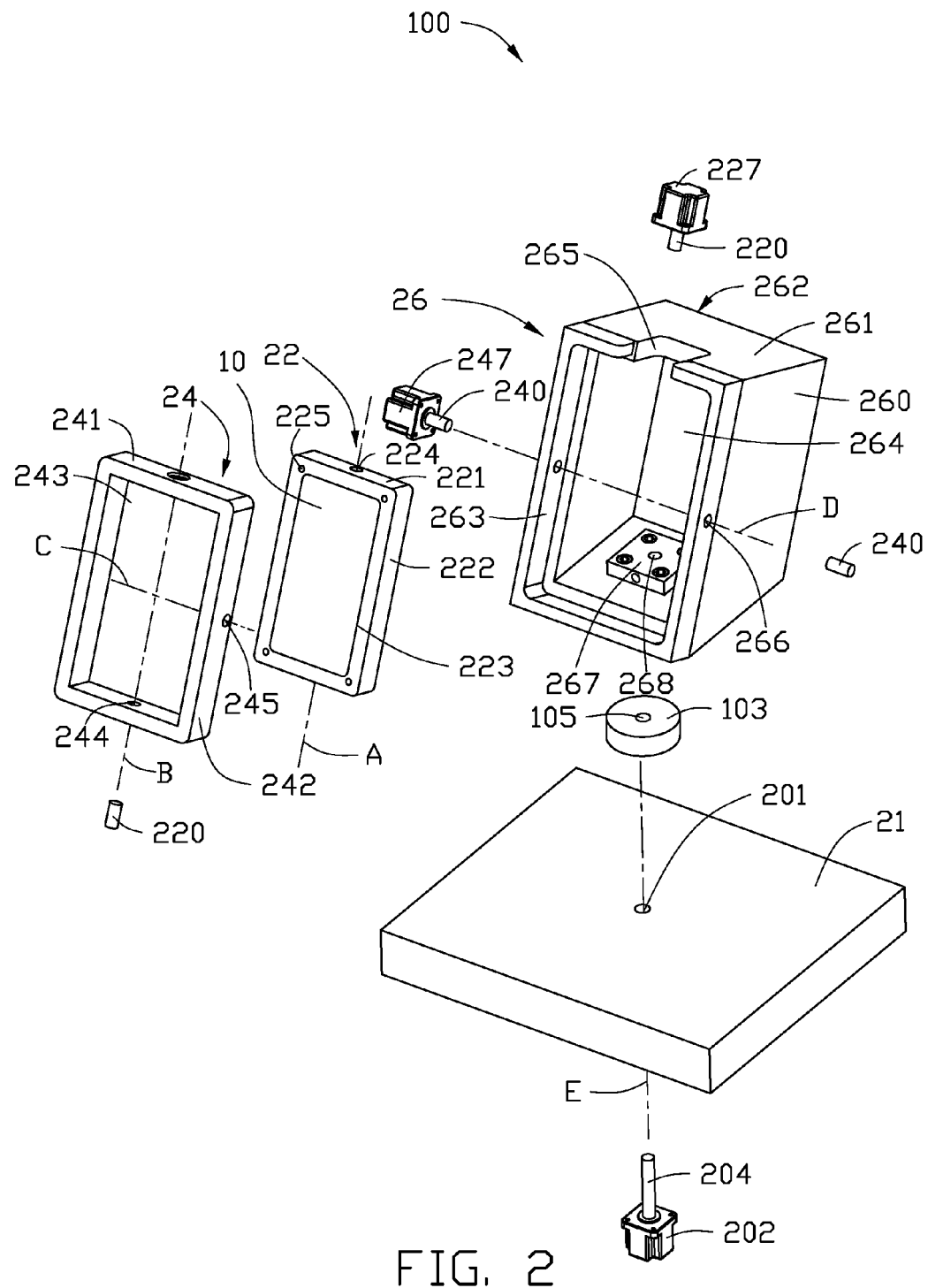
FIG. 2 is an exploded isometric view of the energy conversion device of FIG. 1, the energy conversion device including an energy conversion board and an adjusting device.

Referring to FIG. 2, an exploded isometric view of the energy conversion device of FIG. 1 is shown. In this embodiment, the first frame member 22 includes two opposite first sidewalls 221, two opposite second sidewalls 222 connected with the two opposite first sidewalls 221, and a number of sensors 225. In the embodiment, the sensors 225 are inductors. The first sidewalls 221 and the second sidewalls 222 define a first receiving space 223 to receive the energy conversion board 10. The energy conversion board 10 is a rectangular plate. The first receiving space 223 has a shape to receive the energy conversion board 10, such as a rectangular opening. The energy conversion board 10 is received and fixed in the first frame member 22 by means of locking, integral forming, sticking, or threaded connection. In another embodiment, the energy conversion board 10 may also be circular frame, elliptical, or hexagonal, and the first frame member 22 can thus be a circular ring frame, an elliptical ring frame, or a hexagonal frame to correspond to the shape of the energy conversion board 10.

The first frame member 22 defines a first pivot hole 224 in each of the two first sidewalls 221. The first pivot hole 224 extends through the first sidewall 221 from the inside to the outside. Both first pivot holes 224 are located along a first rotating axis A. The first rotating axis A perpendicularly crosses the two first sidewalls 221. In this embodiment, each first pivot hole 224 is defined in the center of each of the first sidewalls 221.

A sensor 225 is placed at each corner of the first frame member 22. The sensors 225 sense the intensity of the sun's light. In this embodiment, there are four sensors 225 on four corners of the first frame member 22. In another embodiment, there are more than four sensors 225 placed on the first frame member 22.

The second frame member 24 has a shape to closely match the first frame member 22. In this embodiment, the second frame member 24 is also substantially a rectangular frame. In another embodiment, the second frame member 24 can be substantially a circular ring frame, an elliptical ring frame, and a hexagonal frame corresponding to the shape of the first frame member 22. The second frame member 24 includes two opposite third sidewalls 241, and two opposite fourth sidewalls 242 connected with the two opposite third sidewalls 241. The third sidewalls 241 and the fourth sidewalls 242 define a second receiving space 243 to receive the first frame member 22.

The second frame member 24 defines a second pivot hole 244 in each of the two third sidewalls 241 at a position where the first rotating axis A crosses the second frame member 24 when the first frame member 22 is received in the second receiving space 243. The second pivot hole 244 extends through the third sidewall 241 from the inside to the outside. Both second pivot holes 244 are located along a second rotating axis B. The second rotating axis B is coaxial with the first rotating axis A. In this embodiment, each second pivot hole 244 is defined in the center of each of the two third sidewalls 241. Two first shafts 220 successively pass through the second pivot holes 244 and the first pivot holes 224 to pivotally connect the first frame member 22 to the second frame member 24. Therefore, the first frame member 22 with the energy conversion board 10 can rotate 360 degrees around the first rotating axis A and the second rotating axis B relative to the second frame member 24. When the first frame member 22 with the energy conversion board 10 rotates around the first rotating axis A and the second rotating axis B until the first frame member 22 and the second frame member 24 are coplanar, the first frame member 22 with the energy conversion board 10 is totally within the second receiving space 243 of the second frame member 24.

The second frame member 24 defines a third pivot hole 245 in each of the two fourth sidewalls 242. In this embodiment, each third pivot hole 245 is defined in the center of each of the two fourth sidewalls 242. Both third pivot holes 245 are located along a third rotating axis C. The third rotating axis C is perpendicular to the second rotating axis B.

The third frame member 26 has the same shape as the second frame member 24. In this embodiment, the third frame member 26 is substantially a cuboid frame. In an alternate embodiment, the third frame member 26 may be substantially a spherical frame, an elliptical frame, or a hexagonal frame corresponding to the shape of the second frame member 24. The third frame member 26 includes two opposite fifth sidewalls 260, two opposite sixth sidewalls 261, a seventh sidewall 262 interconnected with the sixth sidewalls 261, and a fixing board 267. The two fifth sidewalls 260, the two sixth sidewalls 261 and the seventh sidewall 262 surround a third receiving space 264 to receive the first frame member 22 and the second frame member 24. The two fifth sidewalls 260 and the two sixth sidewalls 261 interconnect to form an opening 263. The first frame member 22 and the second frame member 24 are received in the third receiving space 264 through the opening 263.

Each fifth sidewall 260 defines a fourth pivot hole 266 corresponding to the third pivot hole 245. The fourth pivot hole 266 extends through the fifth sidewall 260 from the inside to the outside. Both fourth pivot holes 266 are located along a fourth rotating axis D coaxial with the third rotating axis C. In this embodiment, each fourth pivot hole 266 is defined in the center of each of the two fifth sidewalls 260. Two second shafts 240 successively pass through the third pivot holes 245 and the fourth pivot holes 266 to pivotally connect the second frame member 24 to the third frame member 26. The second frame member 24 with the first frame member 22 and the energy conversion board 10 can rotate around both the third rotating axis C and the fourth rotating axis D inside the third frame member 26. The second shafts 240 are at 90 degrees to the first shafts 220. When the second frame member 24 with the first frame member 22 and the energy conversion board 10 rotate around the third rotating axis C and the fourth rotating axis D until the second frame member 24, the first frame member 22 and the third frame member 26 are coplanar, the second frame member 24, the first frame member 22 and the energy conversion board 10 are totally within the third receiving space 264 via the opening 263. At this time, the adjusting device 100 is said to be in an initial state (see FIG. 1).

The fixing board 267 is fastened on one of the two sixth sidewalls 261. A fifth pivot hole 268 is defined in the fixing board 267. In this embodiment, the fifth pivot hole 268 is defined in the center of the fixing board 267. The fifth pivot hole 268 extends through the fixing board 267 and one of the two sixth sidewalls 261 supporting the fixing board 267. The fixing board 267 is fastened to the third frame member 26 via screws.

The other one of the two sixth sidewalls 261 which is farthest from the fixing board 267 defines a notch 265 communicating with the opening 263.

In this embodiment, the base 21 is substantially a square plate. A sixth pivot hole 201 corresponding to the fifth pivot hole 268 is defined in the base 21. The sixth pivot hole 201 runs through the base 21. A fixing block 103 is sandwiched between the base 21 and the other one of the two sixth sidewalls 261. A seventh pivot hole 105 corresponding to the sixth pivot hole 201 is defined in the fixing block 103. The seventh pivot hole 105 runs through the fixing block 103.

The fixing block 103 is sleeved on a third shaft 204, and supports the third frame member 26. The third shaft 204 successively passes through the sixth pivot hole 201, the seventh pivot hole 105 and the fifth pivot hole 268 to rotatably connect the third frame member 26 to the base 21. The sixth pivot hole 201, the seventh pivot hole 105 and the fifth pivot hole 268 are located along a fifth rotating axis E. The fifth rotating axis E perpendicularly crosses the base 21, the fixing block 103 and the third frame member 26. The third frame member 26 with the second frame member 24, the first frame member 22 and the energy conversion board 10 can rotate around the fifth rotating axis E through a range of 360 degrees relative to the base 21.

In assembly, the energy conversion board 10 is fixed inside the first frame member 22, and the first frame member 22 is fixed inside the second frame member 24 with the first shafts 220 successively passing through the second pivot holes 244 and the first pivot holes 224, to pivotally connect the first frame member 22 to the second frame member 24. One of the two first shafts 220 farthest from the base 21 is further connected to a first motor 227. The first motor 227 is defined on one end of the first shaft 220 away from the first frame member 22, and located outside the second frame member 24. The first motor 227 drives the first frame member 22 with the energy conversion board 10 to rotate clockwise or counterclockwise around the first rotating axis A and the second rotating axis B relative to the second frame member 24, through a range of 360 degrees.

The second frame member 24 is fixed inside the third frame member 26 with the second shafts 240 successively passing through the fourth pivot holes 266 and the third pivot holes 245 to pivotally connect the second frame member 24 to the third frame member 26. One of the two second shafts 240 is further connected to a second motor 247. The second motor 247 is defined on one end of the second shaft 240 farthest from the second frame member 24 and is located outside the third frame member 26. The second motor 247 drives the second frame member 24 with the first frame member 22 and the energy conversion board 10 to rotate around the third rotating axis C and the fourth rotating axis D relative to the third frame member 26.

The fixing block 103 is placed upon the base 21, and the third frame member 26 is placed on the fixing block 103 with the third shaft 204 successively passing through the seventh pivot hole 101, the sixth pivot hole 105 and the fifth pivot hole 268 to pivotally connect the third frame member 26 to the base 21. One end of the third shaft 204 farthest from the third frame member 26 is further connected to a third motor 202. The third motor 202 drives the third frame member 26 with the second frame member 24, the first frame member 22 and the energy conversion board 10 to rotate clockwise or counterclockwise around the fifth rotating axis E relative to the base 21, through a range of 360 degrees.

Figure 3:
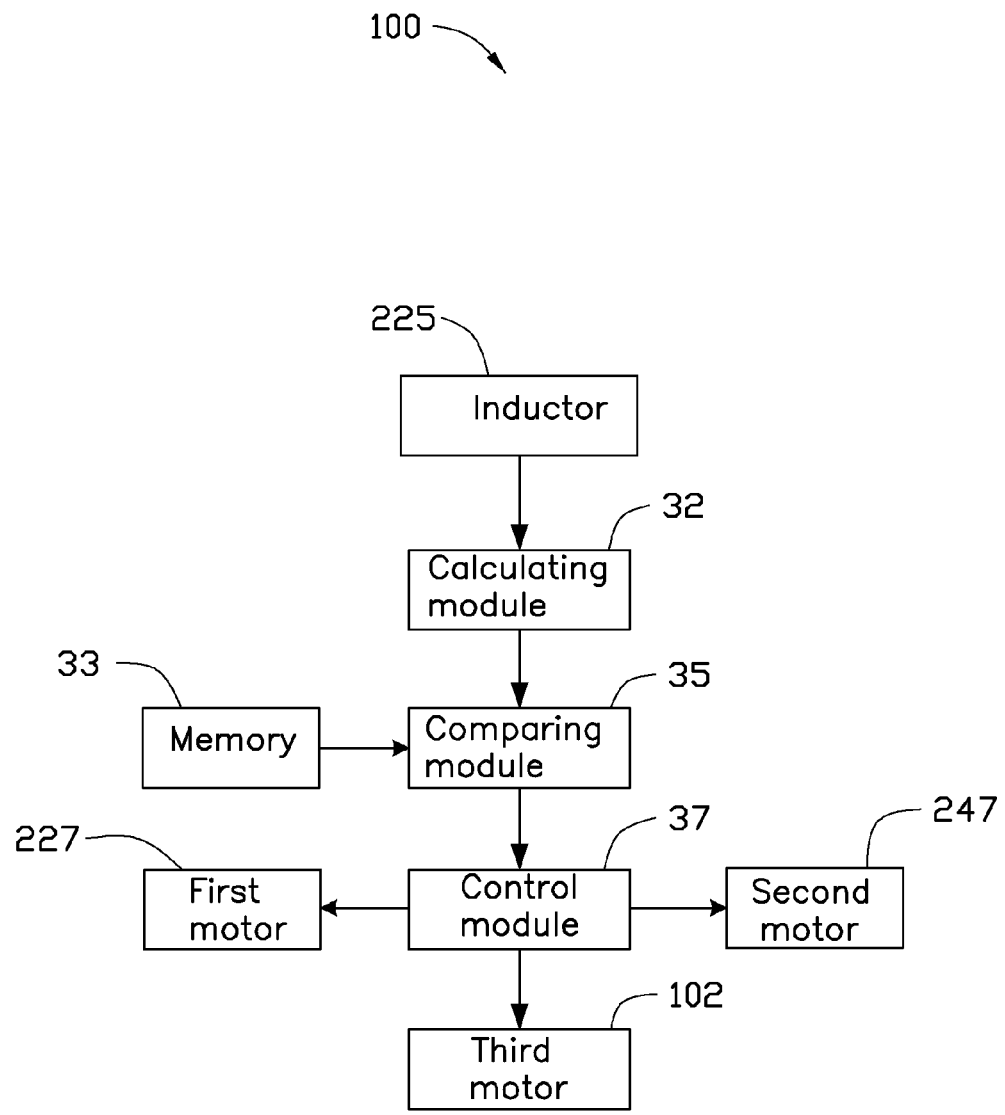
FIG. 3 is a block diagram of the energy conversion device of FIG. 1.

Referring to FIG. 3, the energy conversion device 100 further includes a calculating module 32, a memory 33, a comparing module 35 and a control module 37. In general, the word "module", as used herein, refers to logic embodied in hardware or firmware, or to a collection of software instructions, written in a programming language, such as, Java, C, or assembly. One or more software instructions in the modules may be embedded in firmware, such as in an erasable programmable read only memory (EPROM). The modules described herein may be implemented as either software and/or hardware modules and may be stored in any type of non-transitory computer-readable medium or other storage devices. Some non-limiting examples of non-transitory computer-readable medium include CDs, DVDs, BLU-RAY, flash memory, and hard disk drives.

The calculating module 32 receives signals as to the sensed intensity of sunlight from the sensors 225 and calculates the energy intensity difference between the upper part of the energy conversion board 10 and the lower part of the energy conversion board 10.

The memory 33 stores reference values of energy intensity differences. The reference values of energy intensity differences can be altered according to practical demands.

The comparing module 35 compares the energy intensity differences calculated by the calculating module 32 with the reference values of energy intensity differences stored in the memory 33. If the calculated energy intensity difference is not more than the stored reference value of energy intensity difference, it means that the energy received on the energy conversion board 10 is uniformly distributed. If the calculated energy intensity difference is more than the stored reference value of energy intensity difference, the comparing module 35 generates a first comparing signal.

Figure 4:
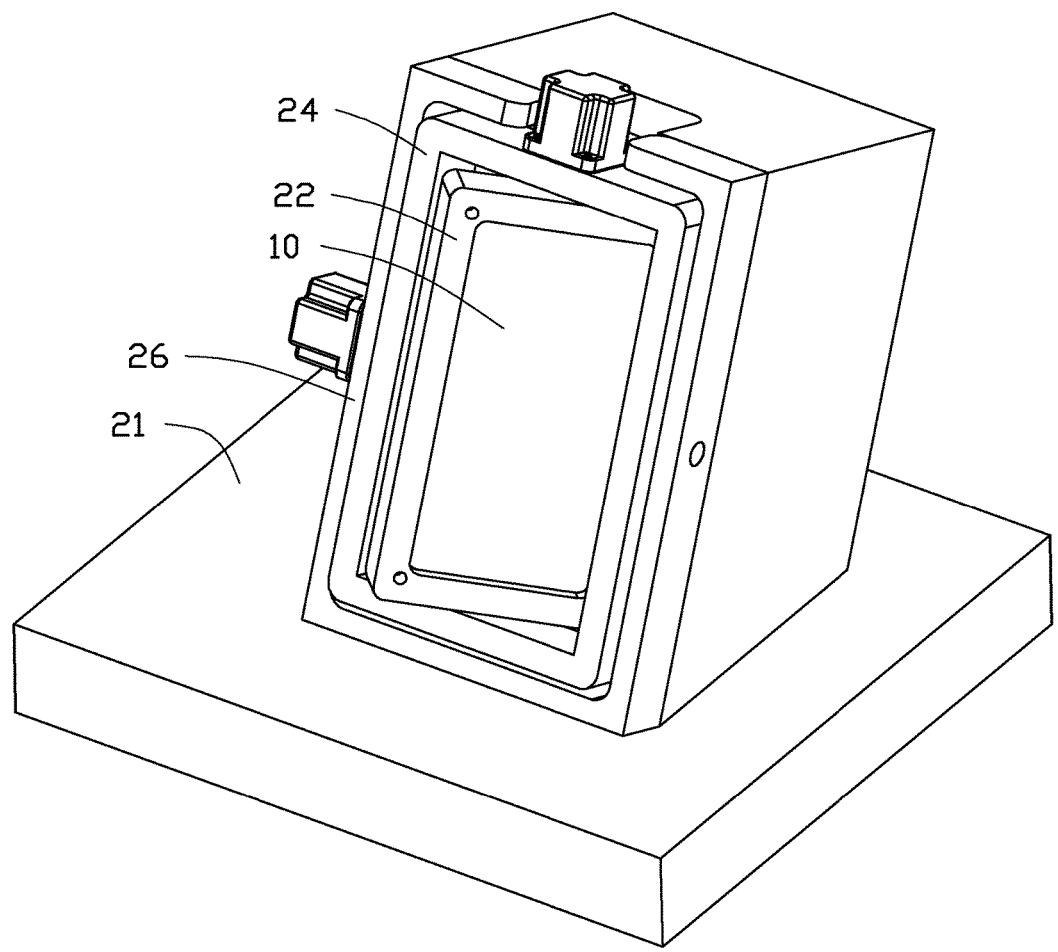
FIG. 4 is an isometric view of the energy conversion device of FIG. 1 when the energy conversion device is in a first working state.
Figure 5:
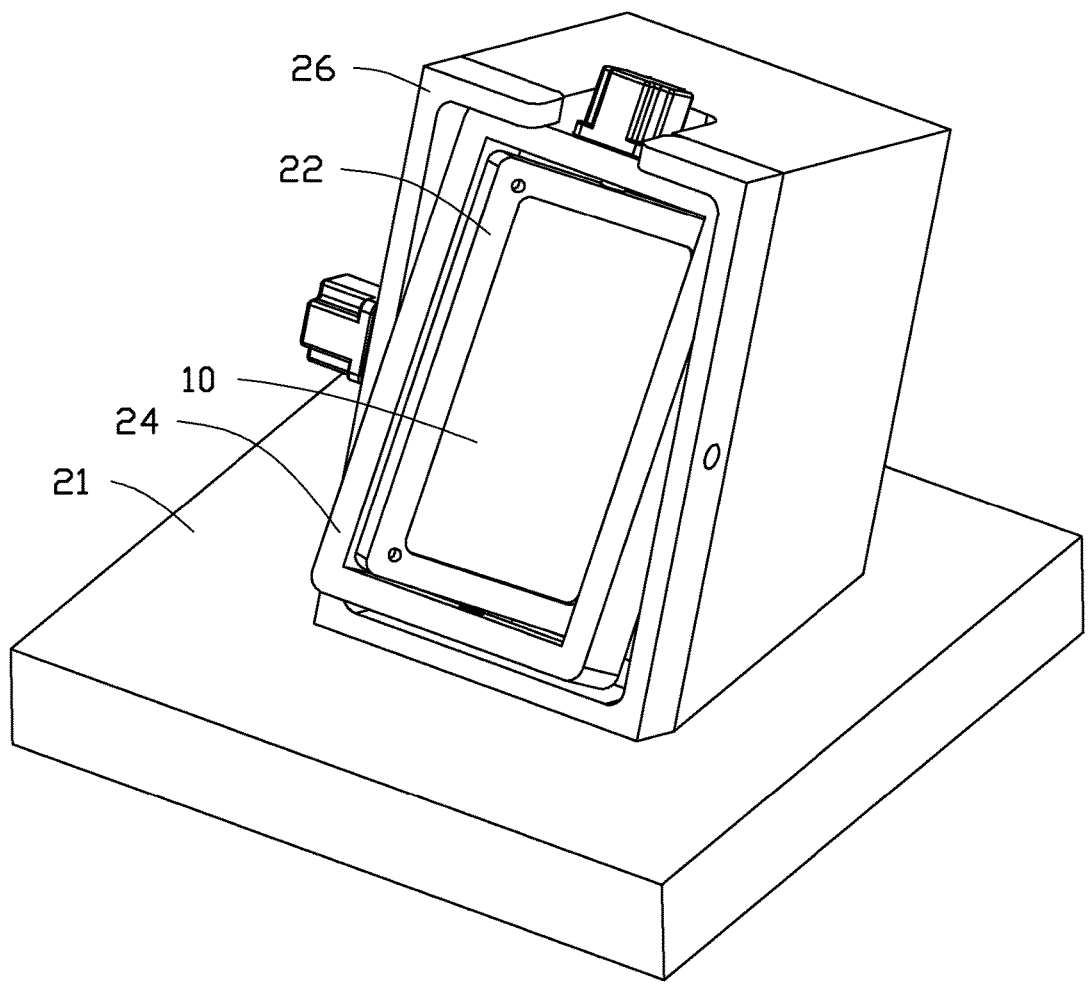
FIG. 5 is an isometric view of the energy conversion device of FIG. 1 when the energy conversion device is in a second working state.
Figure 6:
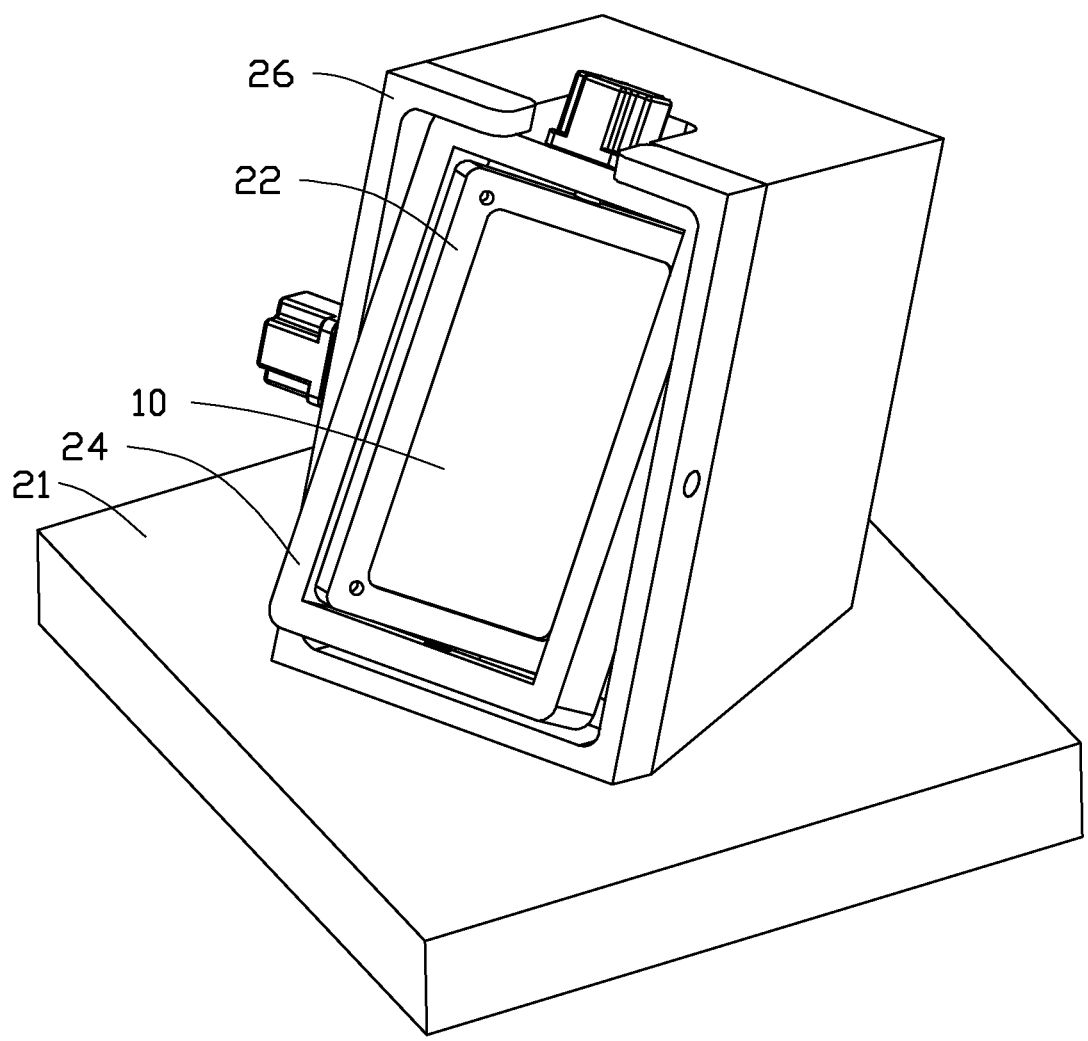
FIG. 6 is an isometric view of the energy conversion device of FIG. 1 when the energy conversion device is in a third working state.

The control module 37 receives the first comparing signal and generates a driving signal corresponding to the first comparing signal, to the first motor 227, the second motor 247, and the third motor 102. Referring to FIG. 4, the first motor 227 drives the first frame member 22 to rotate around the first rotating axis A and the second rotating axis B in the second frame member 24 through a range of 360 degrees. After the first frame member 22 with the energy conversion board 10 rotates a first angle around the first rotating axis A and the second rotating axis B, the first frame member 22 with the energy conversion board 10 rotates from the initial state to a first working state. At this time, the energy conversion device 100 is in the first working state. Referring to FIG. 5, the second motor 247 drives the second frame member 24 with the first frame member 22 and the energy conversion board 10 to rotate 360 degrees around the third rotating axis C and the fourth rotating axis D in the third frame member 26. After the second frame member 24 with the first frame member 22 and the energy conversion board 10 rotate a second angle around the third rotating axis C and the fourth rotating axis D, the second frame member 24 with the first frame member 22 and the energy conversion board 10 have rotated from the first working state to a second working state. At this time, the energy conversion device 100 is in the second working state. Referring to FIG. 6, the third motor 102 drives the third frame member 26 to rotate around the fifth rotating axis E relative to the base 10. After the third frame member 26 with the second frame member 24, the first frame member 22 and the energy conversion board 10 rotate a third angle around the fifth rotating axis E relative to the base 21, the third frame member 26 with the second frame member 24, the first frame member 22 and the energy conversion board 10 have rotated from the second working state to a third working state. At this time, the energy conversion device 100 is in the third working state.

The sensors 225 always sense the intensity of solar energy. The calculating module 32 receives the sensed intensities and calculates the energy intensity difference between the upper part of the energy conversion board 10 and the lower part of the energy conversion board 10. The comparing module 35 compares the calculated energy intensity difference with the stored reference values of energy intensity differences. If the calculated energy intensity difference is not more than the stored reference value of energy intensity difference, it means that the energy on the energy conversion board 10 is uniformly distributed. The comparing module 35 thus generates a second comparing signal.

The control module 37 receives the second comparing signal and generates a stop signal to the first motor 227, the second motor 247 and the third motor 202. The first motor 227, the second motor 247 and the third motor 202 stop driving, and the energy conversion device 100 stops rotating.

With the assistance of several sensors 225 on the energy conversion board 10 and several motors on the energy conversion device 100, the first frame member 22, the second frame member 24 and the third frame member 26 can drive the energy conversion board 10 to rotate to achieve at all times an optimal orientation of the energy conversion board 10 in relation to the sunlight being received. Thus, the energy on the energy conversion board 10 is distributed uniformly, and the utilization rate of the solar energy is improved.

While various embodiments have been described and illustrated, the disclosure is not to be construed as being limited thereto. Various modifications can be made to the embodiments by those skilled in the art without departing from the true spirit and scope of the disclosure as defined by the appended claims.

What is claimed is:

1. An adjusting device for adjusting orientation of an energy conversion board comprising:
    a first frame member for fixing and receiving the energy conversion board;
    a second frame member holding the first frame member, the first frame member being rotatable relative to the second frame member around a first rotating axis;
    a third frame member holding the second frame member, the second frame member be rotatable relative to the third frame member around a second rotating axis; and
    a base supporting the third frame member, the second frame member and the first frame member with the energy conversion board, the third frame member being rotatable relative to the base around a third rotating axis;
    wherein the first rotating axis is perpendicular to the second rotating axis, the third rotating axis is coaxial with the first rotating axis.

2. The adjusting device of claim 1, wherein the second frame member comprises a frame body, the first frame member is pivotally connected inside the frame body of the second frame member, the third frame member is pivotally connected outside the frame body of the second frame member, the bottom of the third frame member is pivotally connected with the base.

3. The adjusting device of claim 2, the first frame member comprises a frame body, the energy conversion board is fixed inside the frame body of the first frame member.

4. The adjusting device of claim 3, wherein a first pivot hole is defined in a sidewall of the first frame member, a second pivot hole corresponding to the first pivot hole is defined in a sidewall of the second frame member, a first shaft passes through the first pivot hole and the second pivot hole to pivotally connect the first frame member to the second frame member.

5. The adjusting device of claim 4, wherein a third pivot hole is defined in a sidewall of the second frame member, the axial direction of the third pivot hole is perpendicular to the axial direction of the second pivot hole, the third frame member comprises a frame body, a fourth pivot hole corresponding to the third pivot hole is defined in a sidewall of the third frame member, a second shaft passes through the fourth pivot hole and the third pivot hole to connect the second frame member to the third frame member.

6. The adjusting device of claim 5, wherein a fixing board is mounted on a bottom sidewall of the third frame member, the fixing board defines a fifth pivot hole, the fifth pivot hole extends through the fixing board and the bottom sidewall of the third frame member, a sixth pivot hole corresponding to the fifth pivotal hole is defined in the base, the fifth pivot hole and the sixth pivot hole are located along the third rotating axis, a third shaft passes through the fifth pivot hole and the sixth pivot hole to pivotally connect the third frame member to the base, the third frame member with the second frame member, and the first frame member with the energy conversion board rotates relative to the base around the third rotating axis.

7. The adjusting device of claim 6, wherein the adjusting device further comprises a fixing block sandwiched between the base and the bottom side of the third frame member, the fixing block defines a seventh pivot hole corresponding to the sixth pivot hole, the third shaft passes through the sixth pivot hole, the seventh pivot hole and the fifth pivot hole to pivotally connect the third frame member to the base.

8. The adjusting device of claim 4, wherein one end of the first shaft connects a first motor, and the first motor drives the first frame member to rotate relative to the second frame member around the first rotating axis.

9. The adjusting device of claim 5, wherein one end of the second shaft connects a second motor, and the second motor drives the second frame member to rotate relative to the third frame member around the second rotating axis.

10. The adjusting device of claim 7, wherein one end of the third shaft further connects a third motor, the third motor drives the third frame member with the second frame member, and the first frame member with the energy conversion board to rotate relative to the base around the third rotating axis.

11. The adjusting device of claim 1, wherein the second frame member further comprises at least one sensor, the at least one sensor is configured to sense the intensity of solar energy.

12. The adjusting device of claim 11, wherein the second frame member comprises four sensors, the four sensors are defined on four corners of the second frame member, respectively.

13. The adjusting device of claim 12, wherein the adjusting device further comprises a calculating module, the calculating module is configured for collecting the energy intensity sensed by the sensors and calculating energy intensity difference between an upper part of the energy conversion board and a lower part of the energy conversion board.

14. The adjusting device of claim 13, further comprising a memory, a comparing module and a control module, the comparing module is connected with the memory and the calculating module, respectively, the control module is connected with the comparing module, the memory is configured for storing reference values of energy intensity differences, the comparing module is configured for comparing the calculated energy intensity difference with the stored reference values of energy intensity differences, and generating a comparing signal to the control module, the control module drives or stops the first motor, the second motor and the third motor corresponding to the comparing signal.

* * * * *